United States Patent [19]
Van Buskirk

[11] Patent Number: 5,653,806
[45] Date of Patent: Aug. 5, 1997

[54] SHOWERHEAD-TYPE DISCHARGE ASSEMBLY FOR DELIVERY OF SOURCE REAGENT VAPOR TO A SUBSTRATE, AND CVD PROCESS UTILIZING SAME

[75] Inventor: Peter C. Van Buskirk, Newtown, Conn.

[73] Assignee: Advanced Technology Materials, Inc., Danbury, Conn.

[21] Appl. No.: 402,142

[22] Filed: Mar. 10, 1995

[51] Int. Cl.$^6$ .................................................. C23C 16/00
[52] U.S. Cl. ............... 118/715; 204/298.07; 239/132.3; 118/666; 118/667; 118/688; 118/724
[58] Field of Search ................................. 118/715, 724, 118/666, 667, 688; 428/248.1; 204/298.07; 239/13, 132.1, 132.3

[56] References Cited

U.S. PATENT DOCUMENTS

| 3,098,763 | 7/1963 | Deal | 118/49.5 |
|---|---|---|---|
| 3,578,495 | 5/1971 | Pammer et al. | 118/715 |
| 4,313,783 | 2/1982 | Davies | 156/643 |
| 4,798,165 | 1/1989 | DeBoer et al. | 118/715 |
| 4,807,562 | 2/1989 | Sandys | 118/725 |
| 4,820,371 | 4/1989 | Rose | 156/345 |
| 4,825,809 | 5/1989 | Mieno | 118/725 |
| 4,909,914 | 3/1990 | Chiba et al. | 204/164 |
| 4,987,856 | 1/1991 | Hey et al. | 118/723 E |
| 4,989,541 | 2/1991 | Mikoshiba et al. | 118/723 |
| 4,991,541 | 2/1991 | Sugata et al. | 118/716 |
| 4,993,358 | 2/1991 | Mahawili | 118/715 |
| 5,000,113 | 3/1991 | Wang | 118/723 |
| 5,105,761 | 4/1992 | Charlet et al. | 118/723 |
| 5,106,453 | 4/1992 | Benko et al. | 156/613 |
| 5,134,963 | 8/1992 | Barbee et al. | 118/715 |
| 5,174,825 | 12/1992 | White, Jr. et al. | 118/715 |
| 5,186,756 | 2/1993 | Benko | 118/730 |
| 5,268,034 | 12/1993 | Vukelic | 118/719 |
| 5,273,588 | 12/1993 | Foster et al. | 118/723 |
| 5,286,519 | 2/1994 | Vukelic | 427/99 |
| 5,387,289 | 2/1995 | Schmitz | 118/725 |
| 5,422,139 | 6/1995 | Fischer | 427/248.1 |
| 5,462,014 | 10/1995 | Awaya | 118/725 |

FOREIGN PATENT DOCUMENTS

| 0 090 586 | 10/1983 | European Pat. Off. . | |
|---|---|---|---|
| 0 540 082 A1 | 5/1993 | European Pat. Off. . | |
| 1.597.833 | 6/1970 | France . | |
| 3635647A1 | 10/1986 | Germany . | |
| 55-18077 | 2/1980 | Japan . | |
| 57-48226 | 3/1982 | Japan . | |
| 60-202937 | 10/1985 | Japan . | |
| 63-32929 | 2/1988 | Japan . | |
| 1-168022 | 7/1989 | Japan | 118/715 |
| WO 90/10092 | 9/1990 | WIPO . | |

OTHER PUBLICATIONS

"Growth of Al Films by Gas Temperature–Controlled Chemical Vapor Deposition." Tsukasa Kobayashi et al., J. Vac. Sci Technol. A 10(3) May/Jun. '92.

"Modeling and Experimental Studies of a Reactive Ion Etcher Using $SF_6/O_2$ Chemistry" Peter M. Kopalidis & Jacob Jorné J. Electrochem. Soc. vol. 140 No. 10 Oct. 1993.

"A Mathematical Representation of a Modified Stagnation Flow Reactor for MOCVD Applications." A.H. Dilawari and J. Szekely Journal of Crystal Growth 108 (1991).

Primary Examiner—Richard Bueker
Assistant Examiner—Jeffrie R. Lund
Attorney, Agent, or Firm—Steven J. Hultquist; Janet R. Elliott

[57] ABSTRACT

An apparatus for dispersingly delivering a vapor-phase source reagent material containing a deposition species, to a substrate for deposition of such species thereon. The apparatus includes a disperser housing having a front wall with an array of discharge openings therein for discharging vapor-phase source reagent material from the housing interior volume onto a wafer or other substrate article mounted in vapor-receiving relationship to the disperser housing front wall. The front wall includes interior heat transfer passages arranged in a manifolded conformation for highly efficient temperature stabilization of the vapor discharged from the housing discharge openings, to produce highly uniform thickness deposited films on the substrate.

14 Claims, 5 Drawing Sheets

COMPARISON SYSTEM

SHOWERHEAD-TYPE DISCHARGE ASSEMBLY FOR DELIVERY OF SOURCE REAGENT VAPOR TO A SUBSTRATE, AND CVD PROCESS UTILIZING SAME

This invention was made with Government support under Contract No. DNA001-92-C0136 awarded by the U.S. Ballistic Missile Defense Organization (BMDO). The Government has certain rights in this invention.

BACKGROUND OF THE INVENTION

1. Field of the Invention

The present invention relate to apparatus and method for delivering a source reagent material in vapor form to a substrate element in a CVD reactor for deposition on the substrate.

2. Description of the Related Art

In the technology of chemical vapor deposition (CVD), it has been common practice to utilize in various applications a wide variety of precursor (source reagent) compositions containing the component to be deposited on the substrate in the chemical vapor deposition reactor. Numerous techniques are known for carrying out CVD. By way of example, U.S. Pat. No. 5,225,561 issued to Peter S. Kirlin et al. discloses CVD source reagents for the formation of high temperature superconductor films including various β-diketonate complexes of barium, strontium, and calcium, and U.S. Pat. No. 5,204,314 issued to Peter S. Kirlin et al. discloses apparatus and method for flash vaporizing source reagents of involatile character and depositing the metal or other component of such source components in the downstream CVD reactor joined in flow communication to the flash vaporization delivery system.

Many chemical vapor deposition and dry etching processes require uniform dispersal of gases. Such dispersal may be effected by a "showerhead"-type device, featuring a multiplicity of gas discharge passages in a face or discharge surface of such device.

Among the vapor phase species utilized in CVD processes, many source reagents maintain their physicochemical character (not decomposing or condensing) only if they are maintained in a narrow range of temperatures.

This is particularly true of many low volatility CVD precursors. For such source reagents, the temperature criticality is particularly challenging to the operation of the CVD process when the heated substrate (on which the deposition is to take place) is in close proximity to the showerhead discharge surface and the substrate has a high "view" factor for the showerhead discharge surface. In these circumstances, the showerhead may be readily driven to unacceptably high temperatures by radiated and convective energy in the process system, which may be on the order of kilowatts in magnitude.

Accordingly, it would be a substantial advance in the art, and is an object of the present invention, to provide an improved showerhead-type dispersing structure for discharging vaporized source reagents to a substrate or other deposition locus in a chemical vapor deposition reactor.

It is another object of the invention to provide such showerhead-type dispersing structure which is capable of being operated in a closely controllable selected temperature range, so that the dispersed CVD source reagent is not heated to temperatures at which the reagent is susceptible to decomposition or degradation.

It is another object of the invention to provide a corresponding method of dispersing CVD source reagents in vapor form, in a manner maintaining the physicochemical stability of such reagents, to carry out the CVD process without the occurrence of substantial degradation or decomposition of the source reagent material.

Other objects and advantages of the invention will be more fully apparent from the ensuing disclosure and appended claims.

SUMMARY OF THE INVENTION

The present invention relates to a showerhead-type disperser for the distribution of fluid to a fluid-receiving locus in proximity to the disperser, having particular utility for effecting a dispersed flow of source reagent vapor to a substrate element in a chemical vapor deposition system, wherein the temperature of the dispersed source reagent vapor must be controllably maintained within a relatively narrow range of temperature in order to efficiently operate the chemical vapor deposition system, without substantial occurrence of either condensation of the source reagent vapor, caused by excessively low vapor temperatures, or decomposition of the vapor, caused by excessively high vapor temperatures.

More particularly, the showerhead-type disperser in the practice of the present invention may suitably comprise a housing enclosing an interior volume therewithin, wherein the housing is joined in flow communication with a supply of source reagent vapor so that source reagent vapor therefrom is selectively flowable into the interior volume of the housing. The housing includes a wall defining a discharge face of the disperser, such wall having an array of discharge passages therein for discharge of the source reagent vapor to a deposition locus in proximity to the wall and in source reagent vapor-receiving relationship thereto. The discharge passages are in spaced-apart relationship to one another, forming a corresponding array of discharge passage openings at the discharge face.

Disposed in heat transfer relationship to the passages in the housing wall and preferably integrally formed therein is an array of heat exchange passages each of which is in spaced-apart heat transfer relationship to a multiplicity of discharge passages in the array. In one embodiment, the heat exchange passages are in parallel spaced-apart relationship to one another, and between adjacently parallel passages in the wall is at least one row of source reagent vapor discharge passages. The heat exchange passages may be manifolded at their inlet and outlet extremities at the periphery of the wall, and coupled with heat exchange medium supply and collection means accommodating flow of a suitable heat exchange medium through the heat exchange passages associated with the wall.

By such arrangement, it is possible to maintain generally isothermal conditions (temperature variations not exceeding ±10% of a target temperature) for a given source reagent, so that the source reagent does not experience deleterious condensation and degradation phenomena due to excessively low or high temperatures at the face of the disperser. Accordingly, the invention in another aspect contemplates a corresponding method of generally isothermal delivery of source reagent vapor to a deposition locus in close proximity to the face of the disperser housing, utilizing a disperser device of a type according to the present invention.

As used herein, the term "source reagent" is intended to be broadly construed to encompass chemical vapor deposition precursor compounds and compositions, in single component form as well as in the form of mixtures.

Other objects and advantages of the invention will be more fully apparent from the ensuing disclosure and appended claims.

DETAILED DESCRIPTION OF THE INVENTION, AND PREFERRED EMBODIMENTS THEREOF

Figure 1:
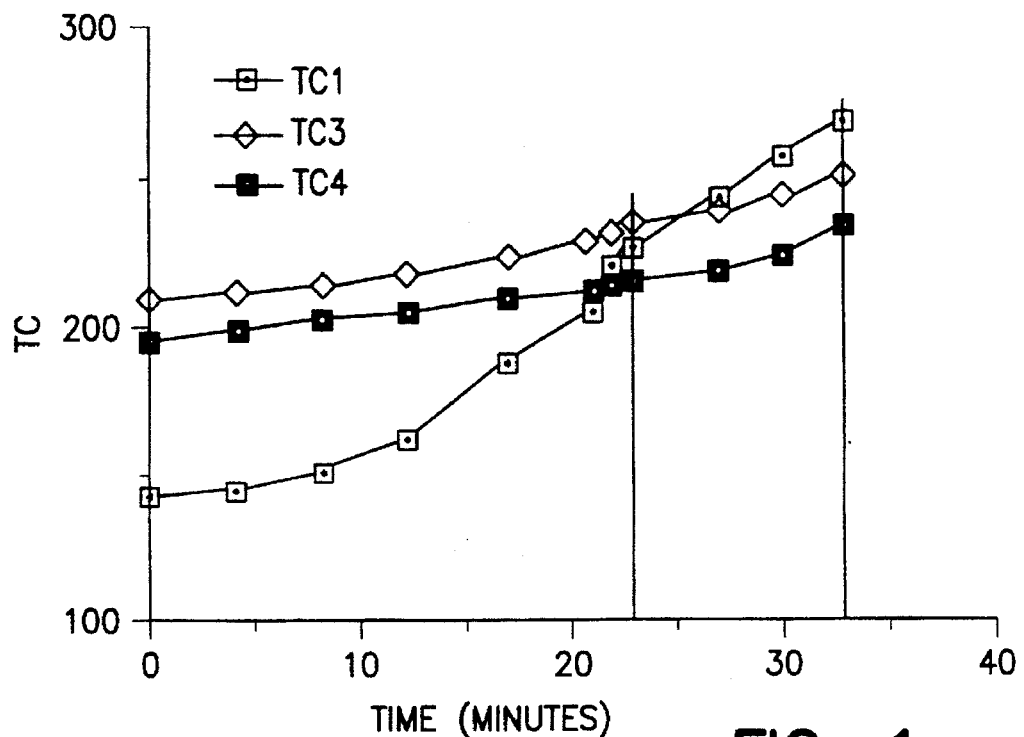
FIG. 1 is a graph of temperature as a function of time as measured at thermocouples (TC1, TC3, and TC4) positioned on a showerhead disperser of a unenhanced design not in accordance with the present invention, for purposes of comparison with a corresponding system that is constructed and operated in accordance with the present invention.

The present invention is based on the discovery that fluid which is susceptible to undesired behavior outside of narrow temperatures ranges, and which is to be delivered to a heated, high-radiant-energy-flux deposition or use locus, can be usefully transported to such locus without occurrence of such deleterious behavior, by use of a showerhead-type disperser including a housing with a wall defining a discharge face of the disperser and containing an array of spaced-apart discharge passages which are in heat transfer relationship to an array of heat exchange passages associated with, and preferably in the wall.

Although heat exchangers of widely varying type are in extremely widespread use in numerous applications, and heat exchangers are widely employed to secure uniformity of temperature in systems in which physical components or materials are susceptible to damage or unacceptable behaviors outside of predetermined operating temperature ranges, the prior art in chemical vapor deposition has not satisfactorily resolved the temperature-related problems attendant the use of chemical vapor deposition source reagents which are relatively non-volatile in character, and require an extremely narrow range of temperature to be useful in for chemical vapor deposition, e.g., organometallic precursors for deposition of metals of Group II of the Periodic Table, e.g., barium, strontium, calcium, titanium, etc.

Further, in many instances, even low level variations in the temperature experienced by the precursor material may cause condensation and/or degradation, which can render the deposited film deficient or even useless for its intended utility from the standpoint of the resulting variation in film stoichiometry and thickness. Unwanted particulates may also result. In many applications, e.g., the formation of high temperature superconducting films, any significant variation in compositional stoichiometry will result in complete loss of superconducting capacity of the film, and in numerous other applications involving the fabrication of microelectronic devices, the acceptable variation in film thickness achieved by CVD processing may be as low as 200 Angstroms (=0.000002 cm) or less.

These fundamental practical problems in chemical vapor deposition have been unexpectedly overcome in the instant invention, by the use of a showerhead-type disperser with integral (heating/cooling) temperature control structure, for maintaining the precursor vapor at a predetermined temperature level, in a manner facilitating the formation of highly uniform (compositionally and dimensionally in terms of thickness) films of the deposited species. The invention thus permits the formation of extremely high quality thin films, over relatively large areas, beyond the ability of the prior art to produce.

Further, in instances where the source reagent is a multicomponent precursor mixture, and wherein extremely close control of the stoichiometry of the film is desired, such as in formation of high temperature superconducting copper oxide films, or microelectronic semiconductor devices, the use of a showerhead-type disperser for the precursor mixture allows thorough mixing and homogeneity to be achieved in the interior volume of the disperser housing, so that the egressed vapor is uniform in composition, and produces a correspondingly homogeneous deposited film of the close stoichiometric tolerance required, over the full areal extent of the deposited film.

Referring now to the drawings, FIG. 1 is a graph of temperature as a function of time as measured at thermocouples (TC1, TC3, and TC4) positioned on a showerhead disperser positioned several inches away from a heater and Si wafer that is held, during film deposition, at about 700° C. For comparison purposes this disperser was not constructed in accordance with the present invention. The graph of FIG. 1 is described more fully hereinafter in Example I. For present purposes, it is to be noted that the curve corresponding to TC1 represents temperature measurements taken an interior point in the central region of the face of the housing of the showerhead disperser.

Figure 2:
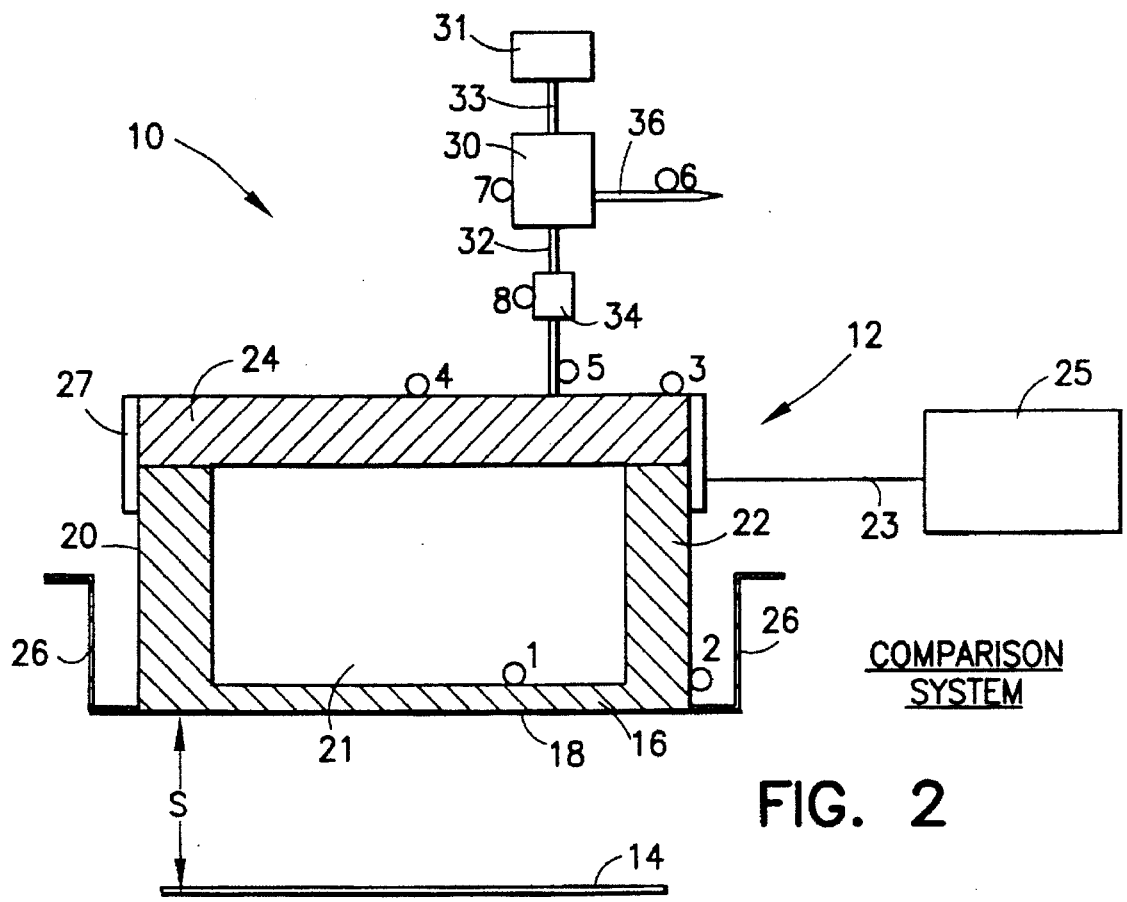
FIG. 2 is a schematic representation of a chemical vapor deposition system comprising a showerhead disperser and associated vaporizer and valve components, showing the position of various thermocouples mounted thereon, including those for which temperature measurements are shown in the graph of FIG. 1 hereof, and with a wafer shown in spaced relationship to the front face of the showerhead disperser.

FIG. 2 is a schematic representation of the chemical vapor deposition system 10 used to generate the data shown in FIG. 1. This apparatus, which is not constructed according to the present invention, but was fabricated for comparative purposes, comprises a showerhead disperser 12 and associated vaporizer 30 and valve 8 components, with the position of various thermocouples mounted on the apparatus being shown by dots numbered with cardinal numbers 1–8, including thermocouple locations 1, 3, and 4, for which temperature measurements are shown in the graph of FIG. 1. The disperser in FIG. 2 is shown with a wafer 14 positioned in spaced relationship to its front face.

The disperser 12 of FIG. 2 comprises a front wall 16 shown in spaced relation to the wafer 14 on which the chemical vapor material is directed through passages in the wall which present an array of vapor flow openings (not shown in FIG. 2) on the front face 18 of the wall 16. The wafer is spaced from the front face 18 of wall 16 by a distance S which may for example be on the order of 3 to 20 centimeters, depending on the specific application and scale of the apparatus.

The disperser 12 comprises a housing 20 including the wall 16, as well as circumscribing side wall 22 and rear wall 24, with the front wall 16 and the rear wall 24 being aligned parallel in relation to one another, and of circular or other shape in the transverse direction, which in the apparatus shown is taken as the direction parallel to the plane of the wafer 14 on its deposition face (top surface in the view illustrated in FIG. 2), with the front and rear walls each having an appropriate thickness in the axial direction, which in the apparatus shown is taken as the direction perpendicular to the plane of the wafer on its deposition face (top surface in the view illustrated in FIG. 2).

The side wall 22 in the apparatus described and illustrated with reference to FIG. 2 is of a cylindrical form, so that the housing thus constructed defines an interior volume 21 enclosed by the respective walls 16, 22, and 24. The housing at the rear portion of the side wall 22 and the edge portion of the rear wall 24 is circumscribed by a band heater 27 which is utilized for the purpose of maintaining the temperature of the housing at a selected value. The band heater is connector by electrical signal wire 23 to the heater control 25, which functions to produce a constant flux of heat from the band heater 27 to the housing, for the purpose of maintaining the temperature of the precursor vapor in the interior volume 21 of the housing at a selected value.

In the FIG. 2 system, the housing 20 is joined at its rear wall 24 with a precursor vapor supply conduit 32 having flow control valve 34 therein. The supply conduit is joined at its rear extremity to the vaporizer 30 which in turn is joined to source reagent supply vessel 31 by means of feed conduit 33. The vaporizer is also provided with a bypass line 36, by means of which the vaporized precursor material formed in vaporizer 30 may be discharged upon closure of valve 34 from the process system without being directed into the housing 20 of the disperser.

At its lower portion in the view shown in FIG. 2, the housing is secured to a mounting plate 26, the mounting plate being itself mounted in the CVD reactor vessel by being mechanically affixed or bonded (by brazing, welding, or the like) to the interior side walls of the CVD reactor vessel.

The housing 20 of the disperser 12 may be formed of any suitable material or materials of construction, as for example metal, e.g., stainless steel, aluminum, etc., which is selected as having suitable heat capacity (specific heat) and thermal conductivity characteristics, as well as being stable in physicochemical character (e.g., being corrosion-resistant, and non-reactive to the precursor vapor) in use.

In use, the precursor liquid in supply vessel 31 is flowed via feed line 33 to the vaporizer 30 in which the source reagent precursor material is volatilized, by heating thereof to a vaporization or volatilization temperature, either in neat form or in admixture or solution with other (carrier or adjuvant) components. The resulting vapor then flows through conduit 32 (valve 34 being open) through the rear wall 24 of the housing (by a feedthrough, not shown in FIG. 2, in such rear wall) into the interior volume 21 of the housing.

In the housing, the precursor vapor is maintained in an elevated temperature condition by means of the band heater 27 operatively controlled by controller 25 as previously described. The precursor vapor then is flowed through the passages in the front wall 16 of the housing in the direction of the wafer 14, so that the precursor vapor deposition species are deposited on the top surface of the wafer at an appropriate desired thickness.

In the use of the apparatus of FIG. 2, it has been found that precursor vapor temperature is extremely difficult to control precisely, and that excessively large temperature variations are experienced. More specifically, "low" temperature spots were experienced which resulted in condensation (plate-out) of the deposition species on the interior surfaces of the housing, including the interior surface of the front wall containing the discharge passages, involving undesired occlusion of such passages, and consequent diminution of the efficiency of the CVD system. Additionally, "hot" spots were generated by radiant heating from the wafer, and the susceptor/mounting plate on which the wafer was mounted (not shown in FIG. 2).

These temperature variations and the associated lack of controllability of the temperature in the housing and at the front face 18 of the wall 16 were a severe operating deficiency, which however are overcome in the practice of the invention.

Figure 3:
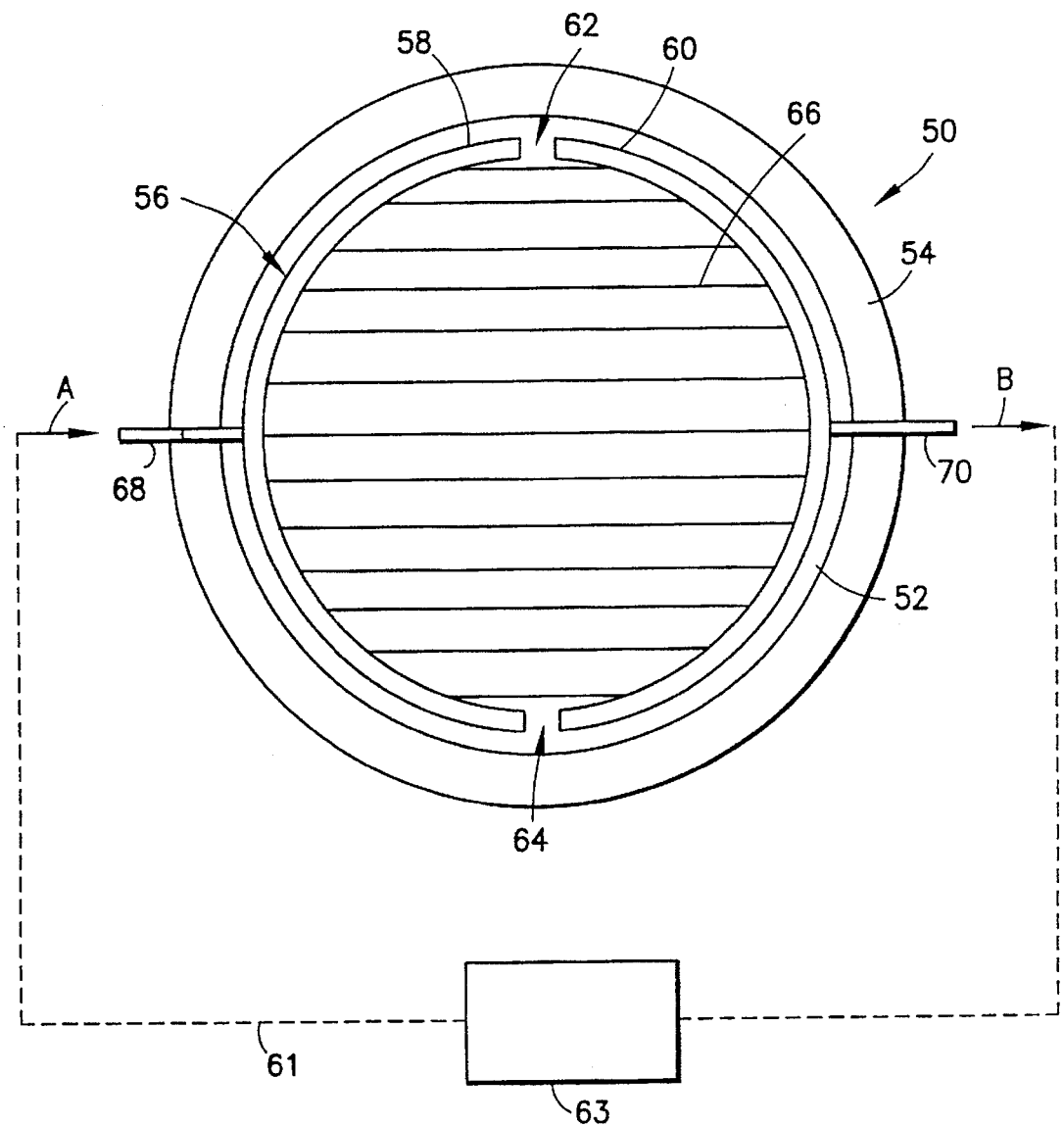
FIG. 3 is a schematic representation of a portion of a showerhead disperser according to one embodiment of the present invention, showing the arrangement of the heat transfer medium flow passages employed for maintaining the temperature of the showerhead within a selected operating range.
Figure 4:
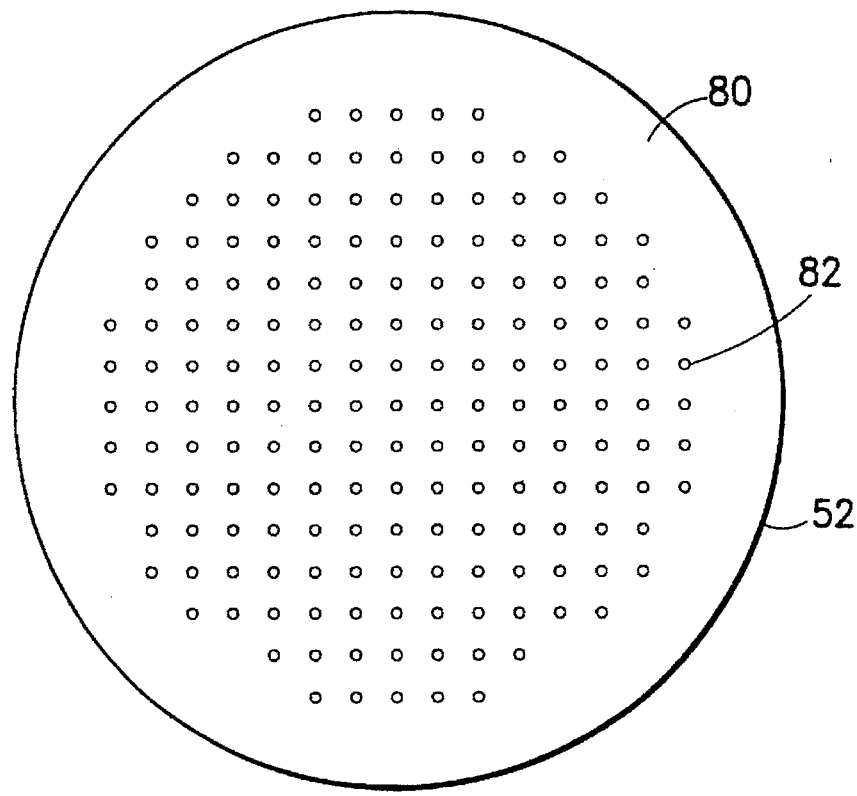
FIG. 4 is a front elevation view of the face of the showerhead disperser, showing the pattern of discharge openings therein.
Figure 5:
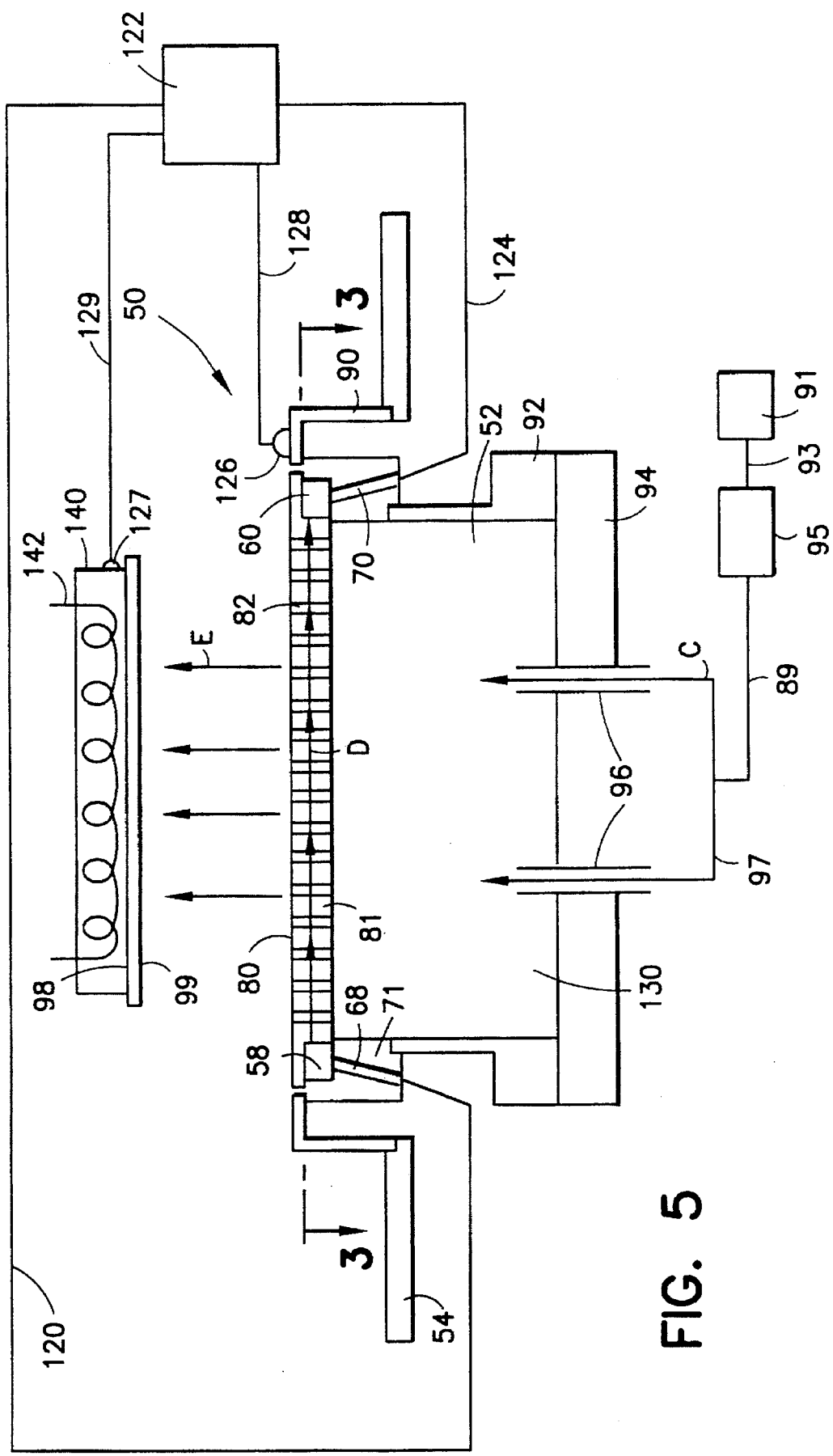
FIG. 5 is a side elevation view of a showerhead disperser according to the present invention, shown as mounted in the chemical vapor deposition chamber, in spaced relation to the wafer mounted therein.

FIGS. 3-5 are various schematic views of a disperser apparatus according to one embodiment of the present invention, FIG. 3 being a front elevation view, taken along line 3—3 of FIG. 5, of the heat exchange components of the showerhead disperser according to the invention, with FIG. 4 being a front elevation view of the discharge face of the disperser of the invention, in one embodiment thereof, and with FIG. 5 being a side elevation section view of a portion of a CVD system including the showerhead disperser and a wafer element disposed in facing relationship to the discharge face of the disperser front wall member.

FIG. 3 shows a portion of a showerhead disperser 50 according to one embodiment of the present invention, showing the arrangement of the heat transfer medium flow passages employed for maintaining the temperature of the showerhead within a selected operating range, even in high-flux radiant energy environments.

The disperser 50 shown in FIG. 3 comprises a housing 52 disposed on a mounting plate 54 for securing the housing in the interior volume of a CVD reactor. The housing 52 has integrally formed in the front wall thereof a manifold heat exchange assembly 56 comprising inlet manifold 58 of arcuate character and outlet manifold 60 of arcuate character, with each of the inlet and outlet manifolds being spaced apart at their respective ends from one another by the spacing gaps 62 and 64 as shown. The inlet and outlet manifolds 56 and 60 are joined in closed flow communication with one another by means of the branch heat exchange passages 66, which are in transversely spaced-apart, parallel relationship to one another as illustrated.

It is to be recognized that the specific form of the branch passages 66 shown in FIG. 3 may be significantly varied in the broad practice of the invention, and may for example take the form of serpentine, ziz-zag linear segments, curvate, or other conformational forms, it being necessary only that the number and form of the branch passages provide effective heat exchange to the entire surface of the discharge wall of the housing containing the egress openings of the housing wall, and that the egress openings and associated passages through the housing wall not be occluded by the branch passages of the heat exchange assembly.

Further, the heat exchange arrangement and means of the invention may be varied from the manifold/branch arrangement shown in FIG. 3, and a unitary passage may be employed which however is circuitously arranged to provide the desired heat exchange relationship to the entire wall of the housing containing the discharge openings through which the precursor vapor is directed toward the substrate member on which the deposition is to be effected.

In the specific heat exchange arrangement shown in FIG. 3, the inlet manifold 58 is coupled with a feed conduit 68, to which is flowed in the direction indicated by arrow A a suitable heat exchange medium, such as oil or other flowable medium which has satisfactory heat capacity, viscosity, and flow characteristics for the specific chemical vapor deposition operation to be carried out in use of the apparatus.

In like fashion, the outlet manifold 60 is coupled with a discharge conduit 70 from which the heat exchange medium is discharge in the direction indicated by arrow B.

It will be recognized that the conduits 68 and 70 may be coupled to a flow circuit and reservoir containing a supply of the heat exchange medium, to provide for continuous recirculation of the heat exchange medium in the operation of the CVD system, such recirculation arrangement being schematically represented in FIG. 3 by the recirculation conduit 61 and the associated recirculation assembly 63 comprising a reservoir and recirculation pump, and associated control means and power supply, of conventional character, for the purpose of carrying out the desired recirculation of the heat exchange medium during the period of operation of the CVD system.

FIG. 4 is a front elevation view of the face 80 of the showerhead disperser 52, showing the pattern of discharge openings 82 therein. As illustrated, the openings at the face of the showerhead disperser are arranged in a regular geometric array comprising vertical and horizontal rows, which provide for a highly dispersed flow of precursor vapor through the associated passages in the wall of the housing of the disperser containing the passage openings 82. It will be recognized that the specific arrangement of the passages and precursor vapor openings in the wall and face of the disperser may be widely varied in the practice of the invention, as may be necessary or desirable in a given end use application of the invention, to secure a uniform flux of the precursor vapor over the full areal extent of the wafer or other substrate on which the deposition species are to be deposited.

FIG. 5 is a side elevation view of the showerhead disperser 50 according to one embodiment of the present invention, shown as mounted in the chemical vapor deposition chamber, in spaced relation to the wafer 98 mounted therein.

The showerhead disperser 50 comprises an downstream wall 80 in the view shown, which is in facing relationship to the deposition surface 99 of wafer 98, and an upstream wall 81. The disperser thus includes a housing 52 formed by wall 81, side wall 92 and rear wall 94 which incorporate the interior volume 130 within the housing. The rear wall 94 of the housing is joined to the circumscribing side wall 92 at the periphery of the rear wall, by suitable joining means such as welding, brazing, mechanical fastening, adhesive bonding, etc. The rear wall 94 is provided with feedthroughs 96 allowing ingress therethrough of precursor vapor, in the direction indicated by arrows C in FIG. 5. The feedthroughs 96 are joined in closed flow communication with precursor feed manifold 97, which in turn is joined to the precursor feed line 89 connected at its other end to the vaporizer 95. The vaporizer 95 in turn is joined by supply line 93 to the precursor supply vessel 91, in which the precursor in suitable liquid or solution form is stored for dispensing in operation of the CVD system.

The side wall 92 of the housing at its upper extremity is joined to the upstream wall 81, as by any of the illustrative joining methods utilized for securing the side wall to the rear wall. The upstream wall 81 as illustrated is formed with an angled flange 90 which in turn is secured to the mounting plate 54 in the interior volume of the CVD reactor.

The upstream wall 81 also includes, interior to the angled flange element 90, an interior lip member 71 to which the side wall 92 is affixed, and which contains the inlet passage 68 and the outlet passage 70 for the heat exchange medium used to cool the front wall against the radiative heat flux incident thereon from the wafer 98 and its associated support 140 heated to high temperature by heating element 142. The front wall therefore is constructed as shown in FIG. 3, with a network of heat exchange passages through which the heat exchange medium is flowed to provide the requisite heat exchange to obviate the radiative heating effects of the wafer/wafer support/susceptor assembly in the CVD system.

The heat exchange medium thus is flowable from the inlet manifold 58 through the branch passages (not shown in FIG. 5; see FIG. 3) in the direction indicated by arrows D in FIG. 5, to the outlet manifold 60. The inlet manifold 58 is joined to the inlet passage 68 which in turn is joined by line 120 to the heat exchange medium supply and pumping assembly 122 which may be constructed and arranged along the lines of the corresponding assembly 63 shown schematically in FIG. 3. The heat exchange medium supply and pumping assembly 122 is correspondingly joined by mean of discharge line 124 (coupled with outlet passage 70 joined to outlet manifold 60) to receive heat exchange medium after its passage through the branch passages in the upstream wall 81 of the housing, thereby forming a continuous loop recirculation sub-system for continuously cooling the front wall of the housing of the disperser in the operation of the appertaining CVD system.

For the purpose of precisely and controllably maintaining the temperature of the front wall of the housing at a selected temperature consistent with non-condensation, non-degradation behavior of the egressing precursor vapor (discharging from the passages 82 in the wall through the corresponding openings at the face 80 of the wall), the upstream wall 81 may have a thermocouple, radiant heat sensor, or other sensing element 126 mounted on the downstream face 80 of the front wall, connected by transmission wire 128 to the heat exchange medium supply and pumping assembly 122 and control means therein, which for example may comprise microprocessor or computer control means, and energy input control means, which produce an output control signal to adjust the heating or cooling of the heat exchange medium in the assembly 122 prior to the heat exchange medium being flowed to the housing of the disperser, to thereby maintain the temperature of the housing and of the precursor vapor therein (in the interior volume 130) flowing through the discharge passages 82, at a selected temperature level for effective operation.

In the arrangement shown in FIG. 5, there is provided a thermostatic controller 137 which is constructed and arranged to sense temperature of wafer support 140 forming a substrate mount for the wafer 98. The thermostatic controller is operatively coupled by transmission wire 129 to the temperature sensor and controller associated with the heat exchange medium supply and pumping assembly 122. The heat exchange supply and pumping assembly 122 as mentioned hereinabove may comprise microprocessor or computer control means for sensing and controlling the temperature of the heat transfer medium to maintain a selected discharge nozzle (disperser) temperature, and the thermostatic controller may be operatively arranged in such system to maintain a selected temperature differential between the discharge nozzle and the substrate 98 mounted on the substrate mount 140.

Figure 6:
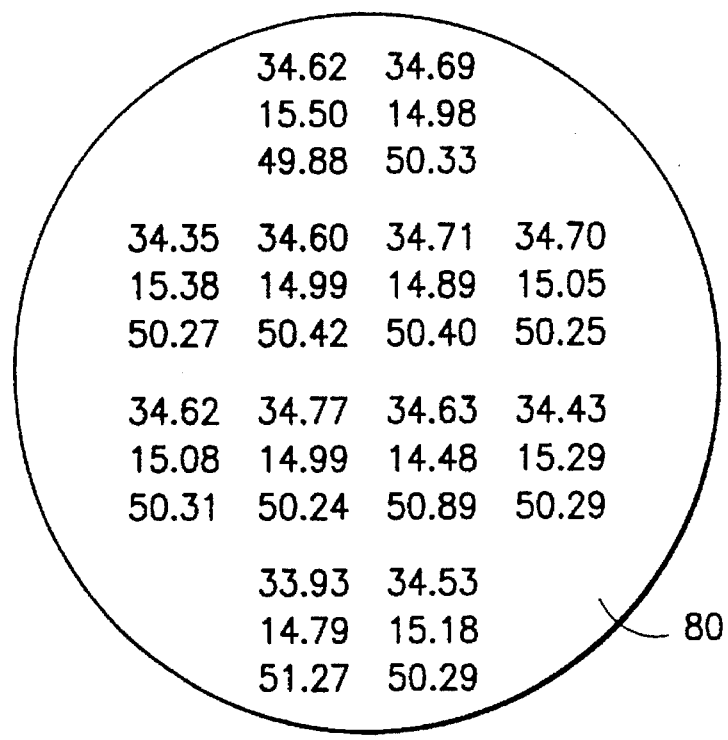
FIG. 6 is a graphical depiction of the composition of barium, strontium, and titanium, in atomic percentages, over the area of a wafer on which a barium strontium titanate film has been deposited utilizing a showerhead disperser constructed in accordance with the present invention.
Figure 7:
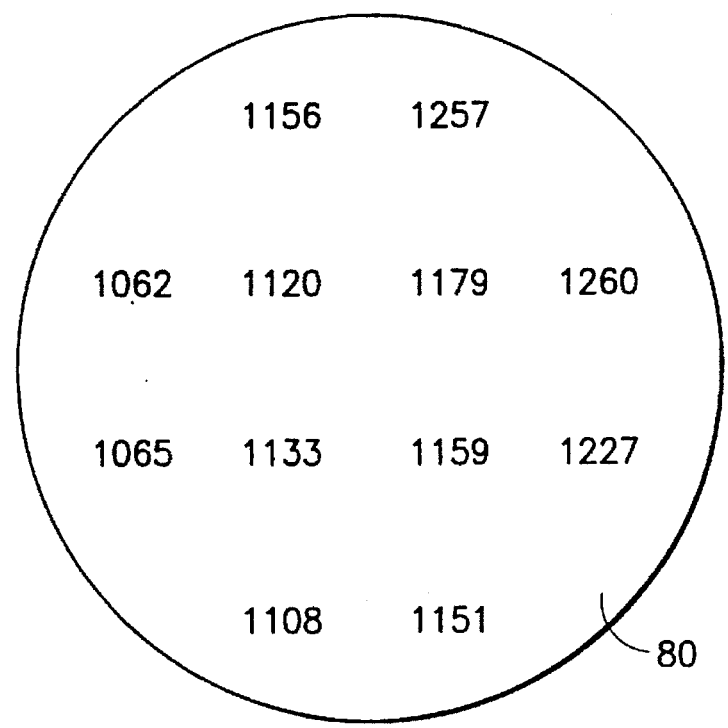
FIG. 7 is a graphical depiction of the thickness of the deposited film on the face of the wafer of FIG. 6.

FIG. 6 is a graphical depiction of the composition of barium, strontium, and titanium, in atomic percentages, over the area of the face of a six-inch diameter wafer, as more fully described in Example II hereof, showing the remarkably uniform stoichiometry of an applied barium strontium titanate, $Ba_{1-x}Sr_xTiO_3$, film. FIG. 7 is a graphical depiction of the thickness, in Angstroms, of the deposited film on the face of the wafer substrate, showing the correspondingly uniform thickness of the applied film over the wafer surface.

Figure 8:
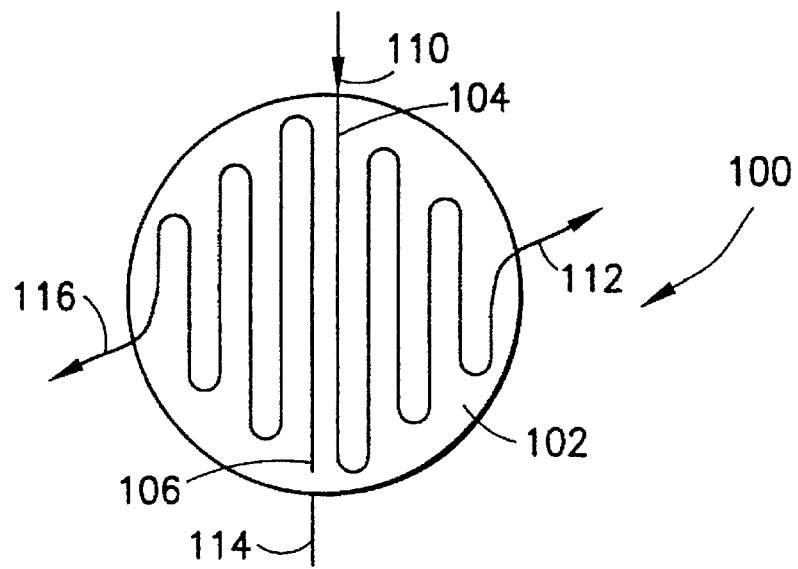
FIG. 8 is a front elevation schematic view of a showerhead disperser heat transfer medium flow path arrangement in which the respective halves of the face have separate serpentine flow channels.

FIG. 8 is a front elevation schematic view of a showerhead disperser 100 according to another embodiment, in which the front wall of the disperser (defining disperser face 102) contains a bifurcated heat transfer medium flow path arrangement in which the respective half-sections of the front wall are provided with integrally formed serpentine flow channels 104 and 106. The serpentine flow channel 104 has an inlet 110 by means of which a suitable heat transfer medium, such as a silicone oil, ethylene glycol solution, or other heat exchange fluid, is introduced to the flow channel for flow therethrough to the outlet 112 of the channel. In like manner, the serpentine flow channel 106 has an inlet 114 by means of which the heat transfer medium is flowable through the flow channel to the outlet 116 of the channel.

It will be recognized that the from wall or other discharge face of the disperser of the present invention may be formed with any suitable geometry, and with any appropriate structure, shape, and size. While it is preferred to utilize a wall member of the housing which is generally, and preferably substantially, planar, it may be desirable in some instances to utilize a ridged or undulant wall member, by means of the shape of which it is possible to accommodate, interior to the ridges or crests thereof, the heat exchange medium flow passages.

The disperser of the present invention achieves a substantial advance in the art in instances where the chemical vapor deposition system includes a wafer or other deposition substrate which may for example have a temperature on the order of 700° C. or even higher, disposed as close as 2 centimeters to the disperser which is discharging precursor vapor at a temperature which desirably is maintained at temperatures which may be as low as 150°–200° C., and in which the deposition substrate and associated support and heating elements may generate a massive radiant heat flux on the disperser. It therefore is highly remarkable that the showerhead-type disperser of the present invention under such operating conditions is able to maintain temperature levels within 10° C. of a selected set point temperature value in close proximity to a surface hundreds of degrees higher in temperature, during an extended CVD run which may for example require several hours to complete.

The features and advantages of the invention are more fully shown by the following examples, wherein all parts and percentages are by weight, unless otherwise expressly stated.

EXAMPLE I

A CVD process was carried out using a Watkins Johnson Select Series 7000 CVD reactor located downstream to a conventional showerhead-type discharge structure for dispensing vaporized source reagents, in an effort to deposit thin films of $BaTiO_3$. $Ba(thd)_2$ was utilized as the barium source reagent precursor compound. When the substrate heater was turned on to raise the substrate temperature to a level suitable for the contemplated CVD process, the temperature of the showerhead inlet assembly quickly rose to unacceptably high levels for the process, due to the large convective and radiative heat load on the showerhead assembly, as shown in the FIG. 1 graph, which is a plot of temperature as a function of time for three temperature sampling locations on the conventional showerhead-type assembly. The substrate heater was set to provide a temperature level of 800° C. (as measured at the susceptor in the chemical vapor deposition reactor). For the susceptor temperature of 800° C., the radiative heat load was estimated to exceed 2 kilowatts, and this is typical in many CVD process systems.

In the graph of FIG. 1, the curves identified as "TC1", "TC3" and "TC4" correspond to the temperature measurement locations identified by the corresponding numerals "1", "3" and "4", respectively, in FIG. 2, which is a schematic depiction of the chemical vapor deposition system's showerhead disperser and associated source reagent supply components, as well as the wafer on which the deposition was intended to be carried out.

The vertical lines in the graph of FIG. 1 delineate the period of time during which the temperature of the showerhead disperser's front face was within a range of temperature in which the barium precursor $Ba(thd)_2$ does not condense or decompose. As shown by the data plotted in such graph, the temperature of the showerhead exceeded the allowable upper temperature for the barium source reagent after only 33 minutes of operation.

In the schematic apparatus representation of FIG. 2, the numerals "1" to "8" identify the location of thermocouples used in the temperature sensing. When the wafer shown in FIG. 2 was held at temperatures exceeding 700° C., the showerhead heated up uncontrollably. Source reagents collected on the inner surface of the showerhead element during the entire period of operation except for the brief time during which the showerhead was in the proper temperature range.

EXAMPLE II

A chemical vapor deposition process system utilizing a showerhead disperser apparatus in accordance with the present invention and constructed as shown in FIGS. 3, 4, and 5 was assembled.

Active control of the disperser and associated apparatus elements was employed in order to prevent decomposition (from excessively high temperatures) or condensation (from temperatures being too low) of the precursor vapor. The disperser apparatus employed circulating hot oil in sealed (welded) oilways through the showerhead assembly as shown in FIG. 3. The inlet and outlet manifolds were built into the assembly in an annular configuration that was interrupted in two places, as illustrated (gaps 62 and 64; see FIG. 3) to force the oil through the parallel paths of the branch passages 66 between the lines of inlet holes.

The temperature of the oil was actively controlled using a commercially available circulating hot-oil system with both heating and cooling capability. Two-dimensional heat and fluid flow calculations were performed and temperature gradients across the showerhead were predicted to be less than ±10° C., which has been found to be satisfactory to prevent condensation or decomposition as the MOCVD precursors flow to the wafer.

The disperser housing was constructed of aluminum. The use of this actively heated/cooled showerhead assembly allowed precise control of showerhead surface (discharge face) temperatures, which were constant within ±1° C. throughout the entire deposition run, which represents substrate heater excursions of approximately 400° C. Excellent thickness and composition uniformity resulted in barium strontium titanate, $Ba_{1-x}Sr_xTiO_3$, films deposited on 6 inch Si wafers using this apparatus, as shown in the stoichiometric uniformity of the deposited film in the data of FIG. 6, wherein each vertical triplet of numbers is the atomic percentages of barium (top), strontium (middle), and titanium (bottom), as an atomic percentage of the total metals concentration, and in the thickness data of FIG. 7, which shows the applied film thickness, in Angstroms, for such deposited film on the substrate wafer.

This areal uniformity of stoichiometric composition and thickness was made possible by the extremely uniform temperature across the surfaces of the showerhead, which was typically controlled at 230° C., despite the proximity of the heated wafer at 700° C., which was approximately 1.5" away from the showerhead. No residue was found on the showerhead surfaces after many deposition runs, although excursions from the target temperature of 230° C. by more than 20° C. will result in decomposition or condensation of the precursors, for surfaces that are too high or too low in temperature, in relation to such acceptable temperature range of 210°–250° C. (230° C. target temperature, ±20° C.).

Although the invention has been described herein with reference to various illustrative embodiments, examples, and structures, it will be appreciated that the utility of the invention is not thus limited, but rather extends to various other and different modifications, variations and embodiments, which are contemplated as being within the spirit and scope of the invention.

What is claimed is:

1. An apparatus for dispersingly delivering a vapor-phase source reagent material containing a deposition species, to a substrate for deposition of the deposition species thereon, wherein the temperature of the dispersed source reagent vapor must be controllably maintained within a relatively narrow range of temperature in order to avoid substantial occurrence of either premature condensation of the source reagent vapor prior to said deposition on the substrate, caused by excessively low source reagent temperatures, or decomposition of the source reagent vapor, caused by excessively high vapor temperatures, said apparatus comprising:

a disperser including a housing enclosing an interior volume therewithin, wherein the housing is joinable in flow communication with a supply of source reagent vapor so that source reagent vapor therefrom is flowable into the interior volume of the housing, said housing comprising a wall defining a discharge face of the disperser, said wall having an array of discharge passages therein for discharge of the source reagent vapor to a substrate in close proximity to the wall and in source reagent vapor-receiving relationship thereto, said discharge passages being in spaced-apart relationship to one another, forming a geometrically regular array of parallel rows of source reagent discharge passage openings at the discharge face, said discharge passage openings extending through said wall; and a manifold heat exchange assembly integrally formed in the housing wall, said manifold heat exchange assembly comprising inlet and outlet manifolds joined in closed flow communication with one another by heat exchange medium branch passages in the housing wall, in transversely spaced-apart, parallel relationship to one another and to said rows of discharge passage openings in the wall, and disposed in heat transfer relationship to the source reagent vapor discharge passages in the housing wall, with each of said heat exchange medium branch passages being in spaced-apart heat transfer relationship to a multiplicity of source reagent vapor discharge passaged in the array, such that the number and form of the heat exchange medium branch passages provide effective heat exchange to the entire surface of the wall of the housing, and such that the discharge passages extending through the wall are not occluded by the heat exchange medium branch passages.

2. Apparatus according to claim 1, wherein the geometrically regular array of source reagent vapor discharge passages comprises vertically and horizontally extending rows of said passages.

3. Apparatus according to claim 1, wherein the heat exchange passages are serpentine in form.

4. Apparatus according to claim 1, wherein the heat exchange passages comprises an array of branch passages extending longitudinally across the housing wall and each joined at its respective extremities to a manifold conduit extending transversely to the longitudinal extent of the branch passages, and with each of said manifold conduits being joined to a heat exchange medium flow conduit, whereby heat exchange medium may be introduced from a first one of said heat exchange medium flow conduits and flowed therefrom through one of said manifold conduits to a first end of each of said branch passages for flow therethrough to a second end thereof and egress from the branch passages into the other of said manifold conduits, from which the heat exchange medium is dischargeable into the other one of said heat exchange medium flow conduits.

5. Apparatus according to claim 4, wherein both of the heat exchange medium flow conduits are coupled in a heat exchange medium supply and pumping circuit, whereby heat exchange medium is circulatable in a closed loop fashion through the circuit.

6. Apparatus according to claim 1, wherein between adjacently parallel heat exchange medium branch passages in the wall is at least one row of source reagent vapor discharge passages.

7. Apparatus according to claim 1, further comprising means for sensing the thermal status of the housing wall and responsively thereto maintaining the temperature of the housing wall within an operating range of temperature condition.

8. Apparatus according to claim 7, wherein the temperature of the housing wall is maintained within said operating range of temperature condition, by said means operating to controllably adjust the heat exchange medium's heat exchange capacity.

9. Apparatus according to claim 8, wherein said controllable adjustment comprises adjusting the temperature and/or flow rate of the heat exchange medium through the branch passages.

10. Apparatus according to claim 7, wherein said means for sensing the thermal status of the housing wall and responsively thereto maintaining the temperature of the housing wall within an operating range of temperature condition, are constructed and arranged to maintain generally isothermal conditions of source reagent vapor flowed through the source reagent vapor discharge passages.

11. Apparatus according to claim 10, wherein said means are constructed and arranged to maintain said generally isothermal conditions within ±10% of a housing wall set point temperature.

12. Apparatus according to claim 1, wherein the wall defining the discharge face of the disperser is planar and circular in shape, and said inlet and outlet manifolds are each of arcuate shape, provided in a peripheral portion of said wall, and in angularly spaced-apart relationship to one another at adjacent extremities thereof.

13. Apparatus for delivering a source reagent material in vapor form to a CVD reactor for deposition on a substrate therein, comprising:

a fluid source reagent supply;

a disperser joined to the fluid source reagent supply in fluid flow relationship thereto, so that fluid source reagent delivered to said disperser from said fluid source reagent supply is dischargeable from the disperser in vapor form;

said disperser including a housing enclosing an interior volume therewithin, said busing comprising a wall defining a discharge face of the disperser, said wall having an array of discharge passages therein for discharge of the source reagent vapor to a substrate in close proximity to the wall and in source reagent vapor-receiving relationship thereto, said discharge passages being in spaced-apart relationship to one another, forming a geometrically regular array of parallel rows of source reagent discharge passage openings at the discharge face, said discharge passage openings extending through said wall;

a manifold heat exchange assembly integrally formed in the housing wall, said manifold heat exchange assembly comprising inlet and outlet manifolds joined in closed flow communication with one another by heat exchange medium branch passages in the housing wall, in transversely spaced-apart, parallel relationship to one another and to said rows of discharge passage openings in the wall and disposed in heat transfer relationship to the source reagent vapor discharge passages in the housing wall, with each of said heat exchange medium branch passages being in spaced-apart heat transfer relationship to a multiplicity of source reagent vapor discharge passages in the array, such that the number and form of the heat exchange medium branch passages provide effective heat exchange to the entire surface of the wall of the housing, and such that the discharge passages extending through the wall are not occluded by the heat exchange medium branch passages;

a heat transfer medium supply joined in fluid flow relationship to the manifold heat exchange assembly and arranged for flow of heat transfer medium through the manifold heat exchange assembly at a sufficient flow rate and temperature to maintain said disperser at a discharge temperature;

a temperature sensor and controller operatively arranged to sense temperature of said disperser and responsive thereto to adjust the temperature of the heat transfer medium flowed from said supply to said manifold heat exchange assembly, to maintain said discharge temperature;

a chemical vapor deposition chamber;

a substrate mount in said chamber, for mounting of a deposition substrate thereon;

said discharge face being arranged and constructed to discharge source reagent vapor toward said substrate mount, with a distance between said discharge face and said substrate mount of from 2 centimeters to about 25 centimeters.

14. Apparatus for delivering a source reagent material in vapor form to a CVD reactor for deposition on a substrate therein, comprising:

a fluid source reagent supply;

a disperser joined to the fluid source reagent supply in fluid flow relationship thereto, so that fluid source reagent delivered to said disperser from said fluid source reagent supply is dischargeable from the disperser in vapor form;

said disperser including a housing enclosing an interior volume therewithin, said housing comprising a wall defining a discharge face of the disperser, said wall having an array of discharge passages therein for discharge of the source reagent vapor to a substrate in close proximity to the wall and in source reagent vapor-receiving relationship thereto, said discharge passages being in spaced-apart relationship to one another, forming a geometrically regular array of parallel rows of source reagent discharge passage openings at the discharge face, said discharge passage openings extending through said wall;

a manifold heat exchange assembly integrally formed in the housing wall, said manifold heat exchange assembly comprising inlet and outlet manifolds joined in closed flow communication with one another by heat exchange medium branch passages in the housing wall, in transversely spaced-apart, parallel relationship to one another and to said rows of discharge passage openings in the wall and disposed in heat transfer relationship to the source reagent vapor discharge passages in the housing wall, with each of said heat exchange medium branch passages being in spaced-apart heat transfer relationship to a multiplicity of source reagent vapor discharge passages in the array, such that the number and form of the heat exchange medium branch passages provide effective heat exchange to the entire surface of the wall of the housing, and such that the discharge passages extending through the wall are not occluded by the heat exchange medium branch passages;

a heat transfer medium supply joined in fluid flow relationship to the manifold heat exchange assembly and arranged for flow of heat transfer medium through the manifold heat exchange assembly at a sufficient flow rate and temperature to maintain said disperser at a discharge temperature;

a temperature sensor and controller operatively arranged to sense temperature of said disperser and responsive thereto to adjust the temperature of the heat transfer medium flowed from said supply to said manifold heat exchange assembly, to maintain said discharge temperature;

a chemical vapor deposition chamber;

a substrate mount in said chamber, for mounting of a deposition substrate thereon;

said discharge face being arranged and constructed to direct source reagent vapor toward said substrate mount from said source reagent supply; and a thermostatic controller constructed and arranged to sense temperature of a substrate mounted on said substrate mount and operatively coupled to said temperature sensor and controller sensing and controlling the temperature of the heat transfer medium to maintain said disperser temperature, wherein the thermostatic controller is operatively arranged to maintain a temperature differential between the disperser and a substrate mounted on said substrate mount.

\* \* \* \* \*